United States Patent
Montree et al.

(10) Patent No.: US 6,251,729 B1
(45) Date of Patent: Jun. 26, 2001

(54) METHOD OF MANUFACTURING A NONVOLATILE MEMORY

(75) Inventors: Andreas H. Montree; Jurriaan Schmitz; Pierre H. Woerlee, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/464,004

(22) Filed: Dec. 15, 1999

(30) Foreign Application Priority Data

Dec. 18, 1998 (EP) .................................................. 98204342

(51) Int. Cl.[7] .................... H01L 21/336; H01L 21/8238; H01L 27/108; H01L 27/10
(52) U.S. Cl. ......................... 438/257; 438/199; 438/201; 257/69; 257/204; 257/206
(58) Field of Search .................................. 438/257–266, 438/275, 279, 199, 197, 200, 201, 218; 257/69, 67, 204, 206, 351, 374

(56) References Cited

U.S. PATENT DOCUMENTS

| | | | |
|---|---|---|---|
| 5,340,764 | 8/1994 | Larsen et al. | 437/52 |
| 5,474,947 | * 12/1995 | Chang et al. | 438/257 |
| 5,512,505 | * 4/1996 | Yuan et al. | 438/264 |
| 5,610,091 | * 3/1997 | Cho | 438/257 |
| 5,756,384 | * 5/1998 | Tseng | 438/257 |
| 5,972,752 | * 10/1999 | Hong | 438/265 |
| 6,093,945 | * 7/2000 | Yang | 257/317 |
| 6,159,797 | * 12/2000 | Lee | 438/257 |
| 6,168,995 | * 1/2001 | Kelley et al. | 438/266 |
| 6,177,314 | * 1/2001 | Van Der Meer et al. | 438/257 |

FOREIGN PATENT DOCUMENTS

| | | |
|---|---|---|
| 09205154 | * 8/1997 | (JP) . |
| 02000232173 | * 8/2000 | (JP) . |

OTHER PUBLICATIONS

"Sub–100nm Gate Length Metal Gate NMOS Transistors Fabricated by a Replacement Gate Process", by A. Chatterjee et al., IEDM 97, pp. 821–824.

\* cited by examiner

Primary Examiner—Trung Dang
Assistant Examiner—Brook Kebede
(74) Attorney, Agent, or Firm—Steven R. Biren

(57) ABSTRACT

In a method of manufacturing a semiconductor device comprising a field-effect transistor and a non-volatile memory element at a surface of a semiconductor body, a first and a second active region of a first conductivity type are defined at the surface of the semiconductor body for the transistor and the memory element, respectively. The surface of the semiconductor body is subsequently coated with a first insulating layer providing a sacrificial gate dielectric of the transistor and a floating gate dielectric of the memory element, which first insulating layer is then covered by a silicon-containing layer providing a sacrificial gate of the transistor and a floating gate of the memory element. After formation of the sacrificial gate and the floating gate, the transistor and the memory element are provided with source and drain zones of a second conductivity type. In a next step, a dielectric layer is applied, which is removed over at least part of its thickness by means of a material removing treatment until the silicon-containing layer at the first and the second active region and is exposed, after which the silicon-containing first active region are removed, thereby forming a recess in the dielectric layer. Subsequently, a second insulating layer is applied at the second active region providing an inter-gate dielectric of the memory element, and a third insulating layer is applied at the first active region providing a gate dielectric of the transistor. After formation of the gate dielectric and the inter-gate dielectric, a conductive layer is applied which is shaped into a gate of the transistor at the first active region and a control gate of the memory element at the second active region.

14 Claims, 3 Drawing Sheets

METHOD OF MANUFACTURING A NONVOLATILE MEMORY

BACKGROUND OF THE OF THE INVENTION

The invention relates to a method of manufacturing a semiconductor device comprising a semiconductor body which is provided at a surface with a field-effect transistor having a gate insulated from the semiconductor body by a gate dielectric, and with a non-volatile memory element having a floating gate and a control gate, the floating gate being insulated from the semiconductor body by a floating gate dielectric and from the control gate by an inter-gate dielectric, by which method a first and a second active region of a first conductivity type adjoining the surface are defined in the semiconductor body for the transistor and the memory element, respectively, and the surface is coated with a first insulating layer providing the floating gate dielectric of the memory element, on which first insulating layer a silicon-containing layer is applied providing the floating gate of the memory element, after which source and drain zones of a second conductivity type of the memory element are provided in the semiconductor body and a second insulating layer is applied at the second active region so as to provide the inter-gate dielectric of the memory element, on which second insulating layer a conductive layer is applied providing the control gate of the memory element.

A method of manufacturing a semiconductor device of the kind mentioned in the opening paragraph is known from U.S. Pat. No. 5,340,764. In the known method, a first series of steps is performed to manufacture the non-volatile memory element consisting of two stacked layers of polycrystalline silicon (called poly hereinafter for short), which are mutually separated by an inter-gate dielectric and insulated from the semiconductor body by a floating gate oxide. After formation of the non-volatile memory element, a second series of steps is performed to manufacture the field-effect transistor. For this purpose a relatively thin gate oxide layer is applied, which is covered by a further poly layer providing the gate of the field-effect transistor. After patterning of, this poly layer, the field-effect transistor is provided with a source and a drain zone by means of a self-aligned implantation using the gate together with adjacent oxide field insulating regions as a mask.

Conventionally, a self-aligned implantation consists of an actual implantation of atoms into the semiconductor body followed by an anneal or so-called drive-in step, which is often carried out at a temperature as high as 1000° C. in order to activate the as-implanted atoms and to repair implantation damage caused to the lattice of the semiconductor body.

A disadvantage of the known method is that the control gate and the inter-gate dielectric of the memory element as well as the gate and the gate dielectric of the transistor are applied prior to the self-aligned implantation of the source and the drain zone of the transistor, and, hence, are subjected to the high-temperature anneal following the actual implantation. Consequently, serious constraints are imposed on the choice of process compatible materials for the gate and the control gate as well as for the gate dielectric and the inter-gate dielectric. A further disadvantage of the known method is that it possesses a rather complex sequential character so as to achieve a separate device optimization for the non-volatile memory element and the field-effect transistor.

SUMMARY OF THE INVENTION

It is an object of the invention to provide a method of manufacturing a semiconductor device of the kind mentioned in the opening paragraph which increases the flexibility as regards the use of process compatible materials for the logic device and the non-volatile device in a conventional CMOS process sequence, and which allows a separate optimization of the logic device characteristics and the non-volatile device characteristics without the complexity of the process sequence being substantially increased.

According to the invention, this object is achieved in that, together with the formation of the floating gate and the floating gate dielectric of the memory element, the first active region is provided with a sacrificial gate and a sacrificial gate dielectric of the transistor, respectively, after which source and drain zones of the second conductivity type of the transistor are provided together with the source and drain zones of the memory element and a dielectric layer is applied which is removed over at least part of its thickness by means of a material removing treatment until the silicon-containing layer at the first and the second active region is exposed, after which the silicon-containing layer and the first insulating layer at the first active region are removed, thereby forming a recess in the dielectric layer, in which recess a third insulating layer is applied providing the gate dielectric of the transistor at the first active region, after which the conductive layer is applied, thereby filling the recess at the first active region, which conductive layer is shaped into the gate of the transistor at the first active region and into the control gate of the memory element at the second active region.

The above measures in accordance with the invention prevent the gate and the gate dielectric of the transistor as well as the control gate and the inter-gate dielectric of the memory element, once formed, from being exposed to the high temperatures, often as high as 1000° C., of the drive-in step carried out after the actual source/drain implantation. This substantially increases the flexibility in the use of process compatible materials for the gate and control gate and for the gate dielectric and inter-gate dielectric into conventional CMOS technology. Moreover, the method in accordance with the invention allows a separate optimization of logic device characteristics and non-volatile device characteristics in conventional CMOS technology while using as many common process steps as possible, thereby reducing the complexity of the process.

The above advantages are achieved by initially providing the field-effect transistor with a sacrificial gate and a sacrificial gate dielectric while at the same time providing the memory element with a floating gate and a floating gate dielectric, and by replacing in a later stage of the process, with the high-temperature anneal associated with the self-aligned implantation of the source and drain zones having been being carried out already, the sacrificial gate and the sacrificial gate dielectric with an actual gate and an actual gate dielectric while at the same time providing the memory element with a control gate and an inter gate dielectric.

The replacement of the sacrificial gate by the actual gate shows a similarity to the replacement gate process described in an article entitled "Sub-100 nm gate length metal gate NMOS transistors fabricated by a replacement gate process", written by Chatterdee et al. and published in IEDM 97 (1997), pp. 821–824. A typical characteristic of the replacement gate technology is that the actual gate is built self-aligned to the source/drain zones with all high temperature anneals performed before the formation of the actual gate.

The sacrificial gate of the transistor and the floating gate of the memory element are formed from a silicon-containing layer comprising polycrystalline silicon, or possibly amorphous silicon or $Ge_xSi_{(1-x)}$ with x the fraction of germanium lying in a range between 0 and 1. Prior to the removal of the sacrificial gate of the transistor a relatively thick dielectric layer is applied covering the sacrificial gate of the transistor and the floating gate of the memory element. The dielectric layer is then removed by means of, for example, chemical-mechanical polishing over at least part of its thickness until the sacrificial gate and the floating gate are exposed. Subsequently, the sacrificial gate of the transistor is removed by means of selective etching. After the removal of the sacrificial gate a dip-etch is carried out in order to remove the subjacent sacrificial gate dielectric of the transistor. During the removal of the sacrificial gate and the sacrificial gate dielectric of the transistor the floating gate and the floating gate dielectric of the memory element are prevented from being exposed to the etch mixtures through the use of a non-critical mask. In this way a recess is formed in the dielectric layer at the positions of the former sacrificial gate and the former sacrificial gate dielectric of the transistor. After applying a second insulating layer at the area of the memory element, thereby providing an inter-gate dielectric of the memory element, a third insulating layer is applied in the recess which provides the actual gate dielectric of the transistor. The surface is subsequently coated with a conductive layer which fills the recess and is shaped into the actual gate of the transistor and the control gate of the memory element.

It has been found experimentally that the moment of stopping the chemical-mechanical polishing (CMP) of the dielectric layer is rather critical. If the CMP process is stopped too early, oxide remainders are left on the sacrificial gate which hinder the subsequent removal of the sacrificial gate. If the CMP process is carried on too long, the definition of the height of the actual gate is adversely affected. In order to improve the height definition of the process, it is preferred to apply the silicon-containing layer as a double layer consisting of a first sub-layer comprising the silicon with on top a second sub-layer composed of a material having a greater resistance to the material removing treatment than silicon and being selectively etchable with respect to the dielectric layer. Hence, the second sub-layer will act as etch stop layer during the removal of the dielectric layer. In this respect it is advantageous to apply silicon nitride as the second sub-layer and silicon oxide as the dielectric layer. Alternatively, aluminum oxide may be used instead of silicon nitride and/or BPSG (borophosphosilicate glass) instead of silicon oxide. The second sub-layer is removed selectively from both the sacrificial gate of the transistor and the floating gate of the memory element prior to the removal of the sacrificial gate. Together with the recess of the transistor, a further recess is thus formed in the dielectric layer at the area of the memory element. The second insulating layer, which provides the inter-gate dielectric of the memory element, is now applied inside the further recess. The conductive layer now fills both recesses. In order to provide a compact gate structure of the transistor together with a compact stacked gate structure of the memory element, the conductive layer is preferably shaped into the gate and the control gate by maskless removal it until either the second or third insulating layer or the dielectric layer is exposed. In this way the gate and the control gate are recessed in the dielectric layer. The above-mentioned maskless removal of the conductive layer is preferably accomplished by means of chemical-mechanical polishing (CMP). A subsequent maskless removal of the second or third insulating layer, if present, is not required, but can be beneficial if the second or third insulating layer comprises a material with a high dielectric constant.

The demands imposed on the gate dielectric as regards optimization of the logic device with gate lengths approaching one tenth of a micrometer are different from those imposed on the floating gate dielectric and inter-gate dielectric as regards optimization of the non-volatile device.

A non-volatile memory element is formed by a transistor with a floating gate, whose threshold voltage is determined by the information written in the form of electric charge on the floating gate. The control gate on the one hand serves to detect what the threshold voltage and, thus, the written information is during reading and on the other hand serves to influence the potential of the floating gate during writing and/or erasing. The floating gate dielectric, which insulates the floating gate from the channel of the memory element, should be thin enough to allow writing and/or erasing and should at the same time be thick enough to prevent leakage of charge from the floating gate once the threshold voltage of the transistor has been raised. Leakage of charge from the floating gate, being caused in general by direct-tunneling effects, is detrimental to the retention time of the memory element, which obviously should be as long as possible. On the above grounds the floating gate dielectric of the memory element, which is conventionally composed of silicon oxide, and, hence, the first insulating layer from which the floating gate dielectric is formed, is advantageously applied with a geometric thickness of about 6 to 10 nm. The inter-gate dielectric of the memory element, which separates the control gate from the floating gate, should be thick enough to prevent charge leakage from the floating gate and should at the same time be thin enough to achieve a large capacitive coupling between the control gate and the floating gate. Moreover, the capacitive coupling between the control gate and the floating gate may be not only improved through a decrease in the geometric thickness of the inter-gate dielectric, but also through an increase in the dielectric constant of the inter-gate dielectric at a given geometric thickness. It is therefore preferred to apply a dielectric material with a dielectric constant higher than that of silicon oxide ($\epsilon \sim 4$) as the inter-gate dielectric of the memory element and, hence, as the second insulating layer from which the inter-gate dielectric is formed.

Furthermore, the gate dielectric of the field-effect transistor, which insulates the gate from the channel of the transistor, should be applied as thin as possible in order to achieve a capacitive coupling between the gate and the channel which is as high as possible. Although leakage currents through the gate dielectric of the transistor are less critical than leakage currents through the floating gate dielectric and inter gate dielectric of the memory element; the gate dielectric of the transistor should be made sufficiently thick. In general, a silicon oxide thickness of at least 1.5 nm is adopted in order to suppress leakage currents. At a given geometric thickness, the capacitive coupling between gate and channel can be improved by increasing the dielectric constant of the gate dielectric. It is therefore preferred to compose the gate dielectric of the transistor and, hence, the third insulating layer from which the gate dielectric is formed of a dielectric material having a dielectric constant higher than that of silicon oxide ($\epsilon \sim 4$). On the above grounds, the gate dielectric of the transistor is advantageously applied in an equivalent oxide thickness, defined as $d/\epsilon_r$ with d the geometric thickness of the layer and $\epsilon_r$ the dielectric constant of the layer relative to that of silicon oxide, of about 1.5 to 4 nm.

For reasons given above, the second insulating layer providing the inter-gate dielectric of the memory element as well as the third insulating layer providing the gate dielectric of the transistor is preferably composed of a dielectric material with a dielectric constant higher than that of silicon oxide ($\epsilon$~4). In this respect tantalum oxide ($Ta_2O_5$; $\epsilon$~20–25), aluminum oxide ($Al_2O_3$; $\epsilon$~10) or silicon nitride ($Si_3N_4$; $\epsilon$~7) can be applied to advantage as these materials are deposited in a conformal and reproducible way by means of chemical vapor deposition (CVD). It is to be noted that the application of a high dielectric constant gate dielectric/inter-gate dielectric in the prior art method may lead to a degradation of the corresponding dielectric properties upon exposure to the high temperatures of the anneal associated with the source/drain implantation of the transistor. In the method of the present invention, the gate dielectric/inter-gate dielectric, once formed, is not exposed to high temperatures in subsequent process steps.

In order to keep the number of masks in the process at a minimum, it is preferred to apply the second insulating layer and the third insulating layer as part of one common layer which provides the inter-gate dielectric of the memory element as well as the gate dielectric of the transistor.

To achieve a successful optimization of both the memory element characteristics and the transistor characteristics, it is preferred, for reasons given earlier, to apply the third insulating layer providing the gate dielectric of the transistor with an equivalent oxide thickness, defined as $d/\epsilon_r$ with d the geometric thickness of the layer and $\epsilon_r$ the dielectric constant of the layer relative to that of silicon oxide, which is smaller than the equivalent oxide thickness of the first insulating layer providing the floating gate dielectric of the memory element. In this respect the third insulating layer is advantageously applied with an equivalent oxide thickness of about 1.5 to 4 nm while the first insulating layer is applied with an equivalent oxide thickness of about 6 to 10 nm.

The gate as well as the control gate and, hence, the conductive layer from which both are formed, advantageously comprises a metal instead of conventional polycrystalline silicon. In contrast to polycrystalline silicon, metals intrinsically have a relatively low resistance and do not suffer from detrimental depletion effects. In this respect a low-resistance metal such as aluminum, tungsten, copper or molybdenum can be advantageously applied. If a metal is used, the conductive layer is preferably applied as a double layer consisting of a layer comprising the metal on top of a layer acting as an adhesion layer and/or barrier layer. In this respect titanium (Ti) may be applied as the adhesion layer and titanium nitride (TiN) or titanium tungsten (TiW) as the barrier layer. It is to be noted that the application of a metal gate/control gate in the prior art method would lead to melting in the case of an aluminum gate/control gate or cause detrimental interaction between the metal gate/control gate and the gate dielectric/inter-gate dielectric upon exposure to the high temperatures of the anneal associated with the source/drain implantation of the transistor. In the method of the present invention the gate/control gate, once formed, is not exposed to high temperatures in subsequent process steps.

BRIEF DESCRIPTION OF THE DRAWING

These and other aspects of the invention will be apparent from and elucidated with reference to the embodiments described hereinafter. In the drawing.

DESCRIPTION OF THE PREFERRED EMBODIMENT

The invention is illustrated below on the basis of a MOS transistor combined with a non-volatile memory element. It is to be noted that the invention may be advantageously used for any non-volatile memory element known per se, such as an EPROM (Erasable Programmable Read-Only Memory), EEPROM (Electrically Erasable Programmable Read-Only Memory) or flash EEPROM.

Figure 1:
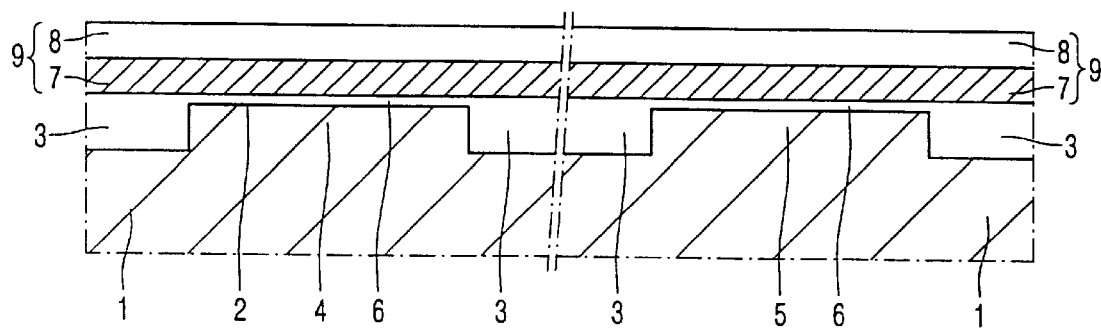
FIGS. 1 to 10 show in diagrammatic cross sectional view successive stages of a process for manufacturing a semiconductor device comprising a field-effect transistor and a non-volatile memory element by means of the method in accordance with the invention.

The process starts (FIG. 1) with a semiconductor body 1 of a first conductivity type, in the present example a silicon body of, for instance, p-type conductivity, which is provided at a surface 2 with relatively thick oxide field insulating regions 3 which lie at least partly recessed in the semiconductor body 1 and which define a first active region 4 in which a field-effect transistor is to be manufactured and a second active region 5 in which a non-volatile memory element is to be manufactured. The thick oxide insulating regions 3 are formed in a usual way by means of LOCOS (LOCal Oxidation of Silicon) or STI (Shallow Trench Isolation). Subsequently, the surface 2 of the semiconductor body 1 is coated with a first insulating layer 6 composed of, for example, silicon oxide, which is covered by a silicon-containing layer 9. The first insulating layer 6 is preferably applied with a geometric thickness of about 6 to 10 nm. In the present example the silicon-containing layer 9 is a double layer consisting of a first sub-layer 7 of, for example, polycrystalline silicon which may be doped with a dopant such as phosphorus or possibly boron, with on top a second sub-layer 8 composed of, for example, silicon nitride. Any other suitable material such as, for example, aluminum oxide or a combination of materials may be used instead of silicon nitride. Amorphous silicon or $Ge_xSi_{1-x}$, with x representing the fraction of germanium lying in the range between 0 and 1 may be used instead of polycrystalline silicon. It is to be noted that the silicon-containing layer may be a single layer as well, composed of polycrystalline silicon, amorphous silicon or $Ge_xSi_{1-x}$.

Figure 2:
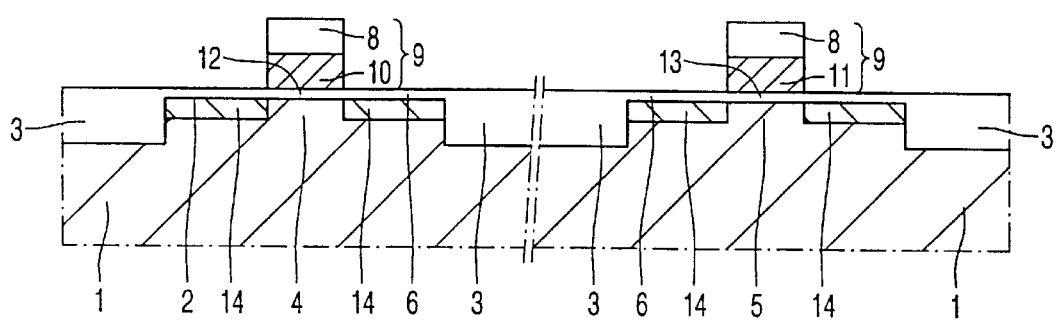

With reference to FIG. 2, the silicon-containing layer 9 is patterned in a usual photolithographic way in order to provide a sacrificial gate 10 at the first active region 4 and a floating gate 11 at the second active region 5. The sacrificial gate 10 and the floating gate 11 are covered by the second sub-layer 8 and are insulated from the semiconductor body 1 by a sacrificial gate dielectric 12 and a floating gate dielectric 13, respectively, both provided by the first insulating layer 6. After patterning of the silicon-containing layer 9, source/drain extensions 14 of a second, opposite conductivity type, in the present example being n-type, are formed on mutually opposed sides of the sacrificial gate 10 at the first active region 4 and on mutually opposed sides of the floating gate 11 at the second active region 5 by means of a self-aligned implantation of a light dose of, for example, phosphorus or arsenic using the silicon-containing layer 9 together with the oxide field insulating regions 3 as a mask.

Figure 3:
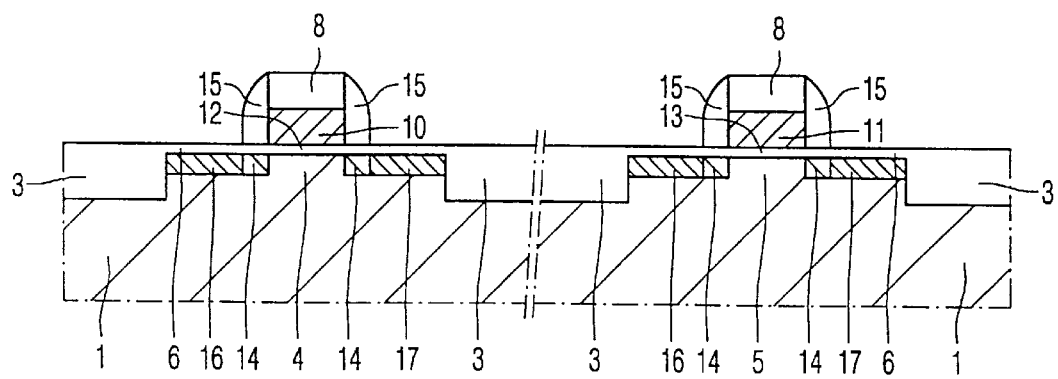

Subsequently, the sacrificial gate 10 of the transistor and the floating gate 11 of the memory element, both covered by the second sub-layer 8, are provided with side wall spacers 15 in a known way, for example, by means of deposition and anisotropic etching-back of a silicon oxide layer (FIG. 3). After formation of the side wall spacers 15, highly-doped source zones 16 and drain zones 17 of the second conductivity type, being n-type in the present example, are formed on mutually opposed sides of the sidewall spacers 15 at both the first and the second active region 4 and 5 by means of a self-aligned implantation of a heavier dose of, for example, phosphorus or arsenic using the oxide field insulating regions 3 together with the silicon-containing layer 9 and the side wall spacers 15 as a mask.

Figure 4:
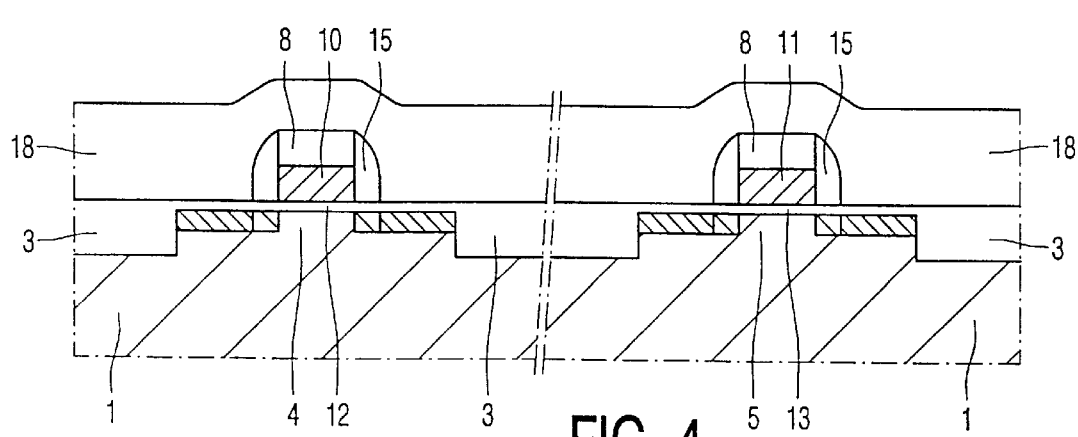

With reference to FIG. 4, a relatively thick dielectric layer 18, in the present example composed of silicon oxide, is deposited. Obviously, other suitable electrically insulating materials such as PSG (phosphosilicate glass) or BPSG (borophosphosilicate glass) may be used as well.

Figure 5:
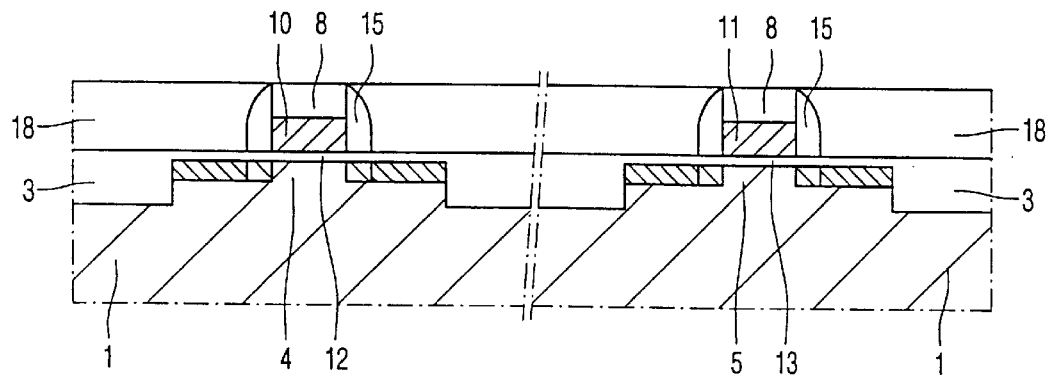

Subsequently, the dielectric layer 18 is removed over at least part of its thickness until the second sub-layer 8 at the first and the second active region 4 and 5 is exposed (FIG. 5). This can be accomplished, for example, by means of chemical-mechanical polishing (CMP) using a commercially available slurry.

Figure 6:
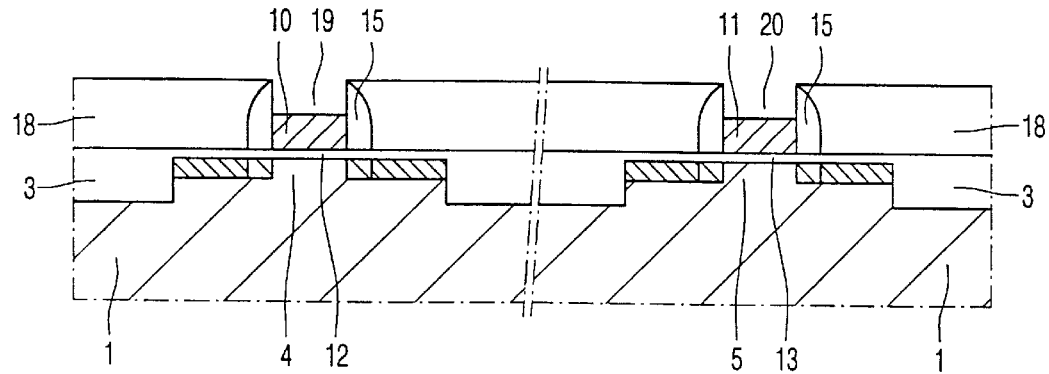

In a next step (FIG. 6), the second sub-layer 8, composed of silicon nitride in the present example, is removed selectively with respect to the dielectric layer 18 and the side wall spacers 15, both composed of silicon oxide in the present example, by means of, for example, wet etching using a mixture of hot phosphoric acid and sulphuric acid. In this way the dielectric layer 18 is provided with a recess 19 at the first active region 4 and a further recess 20 at the second active region 5.

Figure 7:
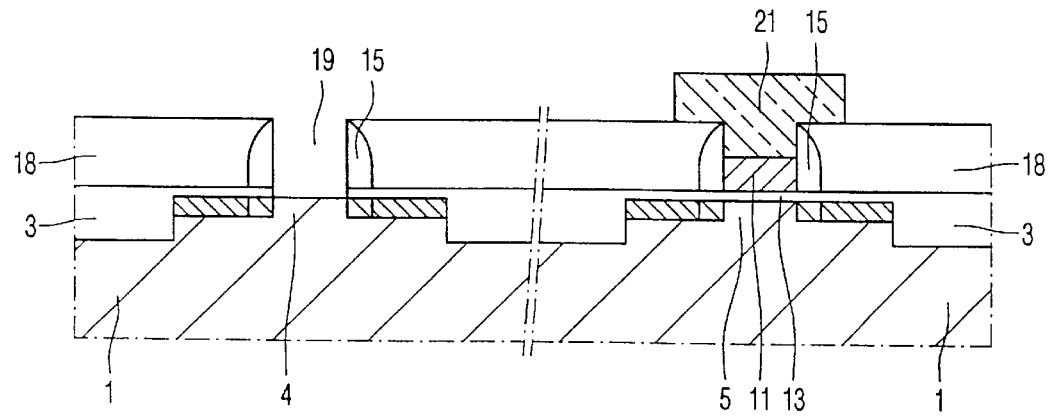

With reference to FIG. 7, a non-critical mask 21 of resist is applied at the second active region 5, after which the sacrificial gate 10 and the sacrificial gate dielectric 12 of the transistor at the first active region 4 are removed in two separate etch steps. The sacrificial gate, in the present example composed of polycrystalline silicon, can be removed selectively by means of wet etching using a hot KOH solution or by means of plasma etching with, for example, a HBr/Cl$_2$ mixture. The sacrificial gate dielectric, in the present example composed of silicon oxide, can be removed by means of wet etching using HF. The non-critical mask 21 prevents the floating gate 11 and the floating gate dielectric 13 of the memory element from being exposed to the above etchants.

Figure 8:
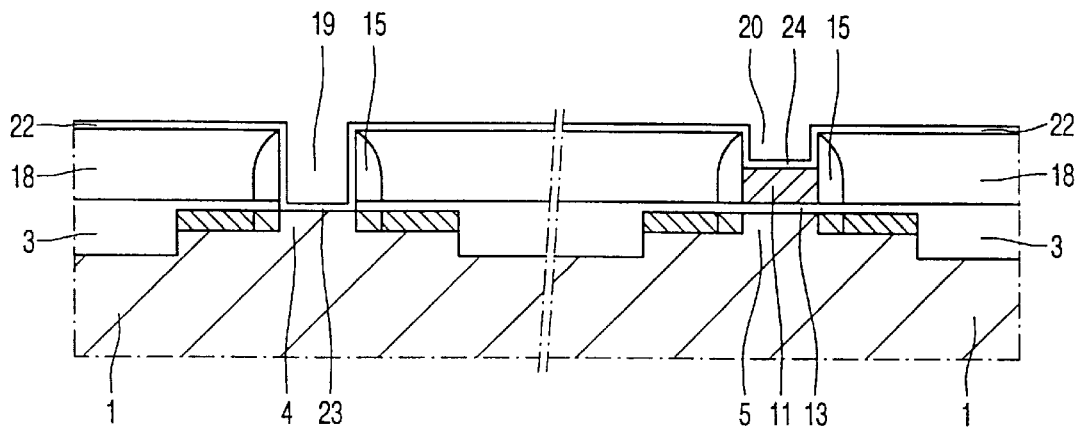

As shown in FIG. 8, a second insulating layer 22 is deposited on all exposed surfaces, thereby providing an inter-gate dielectric 24 of the memory element at the second active region 5 together with an actual gate dielectric 23 of the transistor at the first active region 4. The second insulating layer 22 may be composed of silicon oxide, however, a dielectric material with a dielectric constant higher than that of silicon oxide, such as tantalum oxide, aluminum oxide or silicon nitride is more favorable. The gate dielectric 23 of the transistor is preferably applied with an equivalent oxide thickness, which is defined as $d/\epsilon_r$ with d the geometric thickness of the layer and $\epsilon_r$ the dielectric constant of the layer relative to that of silicon oxide, of about 1.5 to 4 nm. In the present example, the gate dielectric 23 of the transistor and the inter-gate dielectric 24 of the memory element are formed as part of one common layer, i.e. the second insulating layer 22. It will be obvious that, besides a second insulating layer 22 providing, for example, the inter-gate dielectric 24 of the memory element, a third insulating layer (not shown) may be applied providing the gate dielectric 23 of the transistor. In this way the gate dielectric 23 and the inter-gate dielectric 24 are formed from separate insulating layers and, hence, the thickness/composition of the gate dielectric 23 can be completely uncoupled from the thickness/composition of the inter-gate dielectric 24. If present, the third insulating layer will be composed of silicon oxide or preferably of a dielectric material with a dielectric constant higher than that of silicon oxide, such as tantalum oxide, aluminum oxide or silicon nitride. If silicon oxide is to be used for both the gate dielectric 23 and the inter-gate dielectric 24, it may be obtained by means of, for example, chemical vapor deposition or thermal oxidation of silicon, either in one step or in two separate steps, while one of the active regions is shielded with a mask. In the case of thermal silicon oxidation in one step, the thickness of the gate dielectric 23 will be automatically smaller than that of the inter-gate dielectric 24 owing to the higher oxidation rate of polycrystalline silicon compared with that of monocrystalline silicon. The high dielectric constant materials tantalum oxide, aluminum oxide and silicon nitride can be applied, for example, by means of chemical vapor deposition (CVD), either in one step or in two separate steps, while one of the active regions is shielded with a mask.

Figure 9:
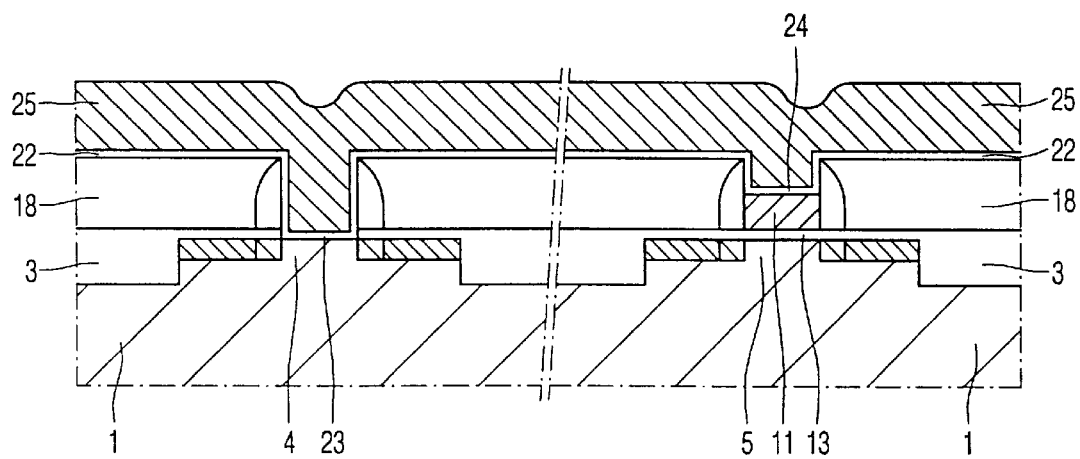

With reference to FIG. 9, a conductive layer 25 is applied on the second insulating layer 22 in a usual way, thereby filling the recess 19 at the first active region 4 and the further recess 20 at the second active region 5. Although polycrystalline silicon or possibly amorphous silicon or $Ge_xSi_{1-x}$ can again be used, the conductive layer 25 now preferably comprises a metal such as aluminum, tungsten, copper or molybdenum, or a combination of metals. It is to be noted that the conductive layer 25 may also be applied as a double layer consisting of a layer comprising a metal or combination of metals on top of a layer acting as an adhesion layer and/or barrier layer. In this case Ti may be applied as the adhesion layer and TiN or TiW as the barrier layer.

Figure 10:
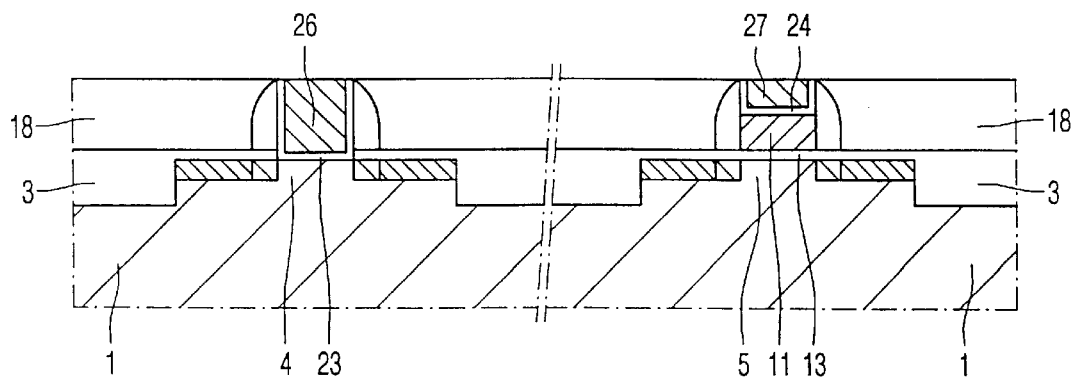

In a next step (FIG. 10), the conductive layer 25 is shaped into an actual gate 26 of the transistor at the first active region 4 and into a control gate 27 of the memory element at the second active region 5. This can be done, for example, by means of etching with an oversized mask at both the first and the second active region 4 and 5. In that case the conductive material of the gate 26 and of the control gate 27 extends over the dielectric layer 18, which is coated with the second insulating layer 22, to beyond the recess 19 and the further recess 20, respectively. However, it is preferred to remove the conductive layer 25 without a mask until the second insulating layer 22 is exposed, thereby forming the gate 26 of the transistor and the control gate 27 of the memory element, both being recessed in the dielectric layer 18. An additional maskless removal of the second insulating layer 22, the result of which is shown in FIG. 10, is not required, but can be beneficial if the second insulating layer 22 comprises a material with a high dielectric constant. Maskless removal of either the conductive layer 25 or both the conductive layer 25 and the second insulating layer 22 is accomplished, for example, by means of chemical-mechanical polishing (CMP) using a commercially available slurry.

Finally, the semiconductor device is completed by conventional CMOS process steps (not shown) for oxide deposition, contact definition and metallization with one or more metal layers.

It will be apparent that the invention is not limited to the embodiments described above, but that many variations are possible to those skilled in the art within the scope of the invention. In order to uncouple the thicknesses/compositions of the gate of the transistor from those of the control gate of the memory element, said gate and control gate may be formed from two separate conductive layers instead of one common conductive layer. The source and drain zones can optionally be implanted without drain extensions in order to obtain a sufficiently high electric field near the floating gate of the memory element for the program/erase procedure. Moreover, in order to reduce the parasitic resistances of the source and drain zones, the source and drain zones may be subjected to a saliciding process using Ti or Co, thereby forming self-aligned silicides of Ti ($TiSi_2$) or Co ($CoSi_2$), respectively, on the source and drain zones. In the embodiments described above, the first and the second active regions are formed by surface regions of the original semiconductor body. Alternatively, the first and the second active region may represent conventional p and/or n wells, which are obtained by means of local doping of the original semiconductor body in regions adjoining its surface with doping concentrations suitable for providing an n-channel or p-channel field-effect transistor and non-volatile memory element.

What is claimed is:

1. A method of manufacturing a semiconductor device comprising a semiconductor body which is provided at a surface with a field-effect transistor having a gate insulated from the semiconductor body by a gate dielectric, and with a non-volatile memory element having a floating gate and a control gate, the floating gate being insulated from the semiconductor body by a floating gate dielectric and from the control gate by an inter-gate dielectric, the method comprising defining a first and a second active region of a first conductivity type adjoining the surface in the semiconductor body for the transistor and the memory element, respectively, and coating the surface with a first insulating layer providing the floating gate dielectric of the memory element; applying a silicon containing layer on the first insulating layer to form the floating gate of the memory element; then providing source and drain zones of a second conductivity type of the memory element in the semiconductor body and applying a second insulating layer at the second active region so as to provide the inter-gate dielectric of the memory element; applying a conductive layer on the second insulating layer to form the control gate of the memory element; and, with the formation of the floating gate and the floating gate dielectric of the memory element, providing the first active region with a sacrificial gate and a sacrificial gate dielectric of the transistor, respectively; then providing source and drain zones of the second conductivity type of the transistor together with the source and drain zones of the memory element and applying a dielectric layer and then removing said dielectric layer over at least part of its thickness by means of a material removing treatment until the silicon-containing layer at the first and the second active region is exposed; then removing the silicon-containing layer and the first insulating layer at the first active region, thereby forming a recess in the dielectric layer; applying a third insulating layer in said recess for providing the gate dielectric of the transistor at the first active region; then applying the conductive layer, thereby filling the recess at the first active region; and shaping the conductive layer into the gate of the transistor at the first active region and into the control gate of the memory element at the second active region.

2. A method as claimed in claim 1, characterized in that the silicon-containing layer is applied as a double layer with a first sub-layer comprising silicon topped by a second sub-layer composed of a material having a greater resistance to the material removing treatment than silicon and being selectively etchable with respect to the dielectric layer, by which method the second sub-layer at the second active region is removed together with the silicon-containing layer at the first active region, thereby forming a further recess in the dielectric layer at the second active region, in which further recess the second insulating layer is applied so as to provide the inter-gate dielectric of the memory element, after which the conductive layer is applied filling the further recess at the second active region together with the recess at the first active region, thereby providing the control gate of the memory element and the gate of the transistor.

3. A method as claimed in claim 2, characterized in that silicon oxide is applied as the dielectric layer, and the second sub-layer is applied by depositing a layer comprising silicon nitride.

4. A method as claimed in claims 2, characterized in that, after the application of the conductive layer and filling of the recess at the first active region together with the further recess at the second active region, the conductive layer is shaped into the gate of the transistor and into the control gate of the memory element by maskless removal of the conductive layer until either the second or third insulating layer or the dielectric layer is exposed.

5. A method as claimed in claim 4, characterized in that the conductive layer is removed by means of chemical-mechanical polishing.

6. A method as claimed in claim 1, characterized in that the second insulating layer and the third insulating layer are applied as part of one common layer providing the gate dielectric of the transistor and the inter-gate dielectric of the memory element.

7. A method as claimed in claim 1, characterized in that a dielectric material having a dielectric constant higher than that of silicon oxide is applied as he third insulating layer.

8. A method as claimed in claim 1, characterized in that a dielectric material having a dielectric constant higher than that of silicon oxide is applied as the second insulating layer.

9. A method as claimed in claim 7, characterized in that a material chosen from the group comprising tantalum oxide, aluminum oxide and silicon nitride is applied as the dielectric material.

10. A method as claimed in claim 1, characterized in that the third insulating layer providing the gate dielectric of the transistor is applied with an equivalent oxide thickness, which is defined as $d/\epsilon_r$ with d the geometric thickness of the layer and $\epsilon_r$ the dielectric constant of the layer relative to that of silicon oxide, which is smaller than the equivalent oxide thickness of the first insulating layer providing the floating gate dielectric of the memory element.

11. A method as claimed in claim 10, characterized in that the third insulating layer is applied with an equivalent oxide thickness of about 1.5 to 4 nm and that the first insulating layer is applied with an equivalent oxide thickness of about 6 to 10 nm.

12. A method as claimed in claim 1, characterized in that the conductive layer providing the gate of the transistor and the control gate of the memory element is applied by deposition of a layer comprising a metal.

13. A method as claimed in claim 12, characterized in that the conductive layer is applied as a further double layer consisting of a layer comprising the metal on top of a layer acting as an adhesion layer and/or barrier layer.

14. A method as claimed in claim 12, characterized in that a metal chosen from the group comprising aluminum, tungsten, copper and molybdenum is applied as the metal.

* * * * *